United States Patent
Kao et al.

(10) Patent No.: US 8,643,101 B2
(45) Date of Patent: Feb. 4, 2014

(54) HIGH VOLTAGE METAL OXIDE SEMICONDUCTOR DEVICE HAVING A MULTI-SEGMENT ISOLATION STRUCTURE

(75) Inventors: Ching-Hung Kao, Hsinchu County (TW); Sheng-Hsiong Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 79 days.

(21) Appl. No.: 13/090,338

(22) Filed: Apr. 20, 2011

(65) Prior Publication Data
US 2012/0267716 A1    Oct. 25, 2012

(51) Int. Cl.
*H01L 29/788* (2006.01)
(52) U.S. Cl.
USPC ........... 257/339; 257/335; 257/368; 257/372; 257/376; 257/E29.255
(58) Field of Classification Search
USPC ........... 257/335, 339, 368, 372, 376, E29.255
See application file for complete search history.

(56) References Cited

U.S. PATENT DOCUMENTS

| | | | |
|---|---|---|---|
| 4,344,081 A | 8/1982 | Pao | |
| 4,396,999 A | 8/1983 | Malaviya | |
| 4,893,160 A | 1/1990 | Blanchard | |
| 4,918,333 A | 4/1990 | Anderson | |
| 4,958,089 A | 9/1990 | Fitzpatrick | |
| 5,040,045 A | 8/1991 | McArthur | |
| 5,268,589 A | 12/1993 | Dathe | |
| 5,296,393 A | 3/1994 | Smayling | |
| 5,326,711 A | 7/1994 | Malhi | |
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,811,850 A | 9/1998 | Smayling | |
| 5,950,090 A | 9/1999 | Chen | |
| 5,998,301 A | 12/1999 | Pham | |
| 6,066,884 A | 5/2000 | Krutsick | |
| 6,144,538 A | 11/2000 | Chao | |
| 6,165,846 A | 12/2000 | Carns | |
| 6,245,689 B1 | 6/2001 | Hao | |
| 6,277,675 B1 | 8/2001 | Tung | |
| 6,277,757 B1 | 8/2001 | Lin | |
| 6,297,108 B1 | 10/2001 | Chu | |
| 6,306,700 B1 | 10/2001 | Yang | |

(Continued)

FOREIGN PATENT DOCUMENTS

TW    I274419    2/2007

OTHER PUBLICATIONS

Nathanaelle Klein, Sharon Levin, Gal Fleishon, Sagy Levy, Alon Eyal, Shye Shapira, Device design tradeoffs for 55v ldmos driver embedded in 0.18 micron platform, pp. 736-740 , IEEE 2008, Israel.

*Primary Examiner* — Thanh V Pham
(74) *Attorney, Agent, or Firm* — Ding Yu Tan (57) ABSTRACT

A high voltage metal oxide semiconductor device with low on-state resistance is provided. A multi-segment isolation structure is arranged under a gate structure and beside a drift region for blocking the current from directly entering the drift region. Due to the multi-segment isolation structure, the path length from the body region to the drift region is increased. Consequently, as the breakdown voltage applied to the gate structure is increased, the on-state resistance is reduced.

16 Claims, 6 Drawing Sheets

(56) References Cited

U.S. PATENT DOCUMENTS

| | | |
|---|---|---|
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly et al. |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,361,955 B2 | 4/2008 | Kao |
| 7,427,552 B2 | 9/2008 | Jin |
| 2002/0106852 A1 | 8/2002 | He |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0081924 A1 | 4/2006 | Ichikawa |
| 2006/0261407 A1 | 11/2006 | Blanchard |
| 2006/0270134 A1 | 11/2006 | Lee |
| 2006/0270171 A1 | 11/2006 | Chen |
| 2007/0040212 A1 | 2/2007 | Cai |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0072319 A1 * | 3/2009 | Sonsky et al. ................. 257/368 |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096697 A1 * | 4/2010 | Su et al. ........................ 257/343 |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2011/0127602 A1 * | 6/2011 | Mallikarjunaswamy ..... 257/331 |
| 2012/0043608 A1 * | 2/2012 | Yang et al. .................... 257/336 |

* cited by examiner

HIGH VOLTAGE METAL OXIDE SEMICONDUCTOR DEVICE HAVING A MULTI-SEGMENT ISOLATION STRUCTURE

FIELD OF THE INVENTION

The present invention relates to a high voltage metal oxide semiconductor device, and more particularly to a high voltage metal oxide semiconductor device having a multi-segment isolation structure under the gate structure in order to withstand a high breakdown voltage and reduce a source-drain on-state resistance.

BACKGROUND OF THE INVENTION

So far, a metal-oxide-semiconductor (MOS) transistor is one of the most common semiconductor devices. The MOS transistor is suitable for producing an integrated circuit with a high integration density.

As known, a lateral diffusion metal oxide semiconductor (LDMOS) device is fabricated as a high voltage component in an integrated circuit. Generally, the high voltage component is designed to withstand a high breakdown voltage and operate at a low source-drain on-state resistance (Rdson). However, since the high breakdown voltage needs a large-sized high voltage component, the source-drain on-state resistance (Rdson) will be increased.

SUMMARY OF THE INVENTION

Therefore, the object of the present invention is to provide a high voltage metal oxide semiconductor (HVMOS) device capable of withstanding a high breakdown voltage and operating at a low source-drain on-state resistance (Rdson). A multi-segment isolation structure is arranged under a gate structure and beside a drift region for blocking the current from directly entering the drift region. In addition, due to the multi-segment isolation structure, the path length from the body region to the drift region is increased. Consequently, as the breakdown voltage of the high voltage metal oxide semiconductor (HVMOS) device is increased, the on-state resistance in the substrate of the high voltage metal oxide semiconductor (HVMOS) device is reduced.

In accordance with an aspect, the present invention provides a high voltage metal oxide semiconductor device. The high voltage metal oxide semiconductor device includes a substrate, a multi-segment first isolation structure, a source region, a drain region and a gate structure. The multi-segment first isolation structure is formed in the substrate, and includes plural segments. The source region and the drain region are respectively arranged at bilateral sides of the multi-segment first isolation structure. The gate structure is disposed over at least a portion of the multi-segment first isolation structure. The use of the multi-segment first isolation structure may increase the conduction path of the current under the gate structure. Consequently, if the breakdown voltage is increased, the on-state resistance is reduced.

In accordance with an aspect, the present invention provides a semiconductor device. The semiconductor device includes a substrate, a multi-segment first isolation structure and plural second isolation structures. The multi-segment first isolation structure is formed under a gate structure, and includes plural segments. The multi-segment first isolation structure is partially overlapped with the gate structure. The plural second isolation structures are arranged at bilateral sides of the substrate. The use of the multi-segment first isolation structure may increase the conduction path of the current under the gate structure. Consequently, if the breakdown voltage is increased, the on-state resistance is reduced.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 7:
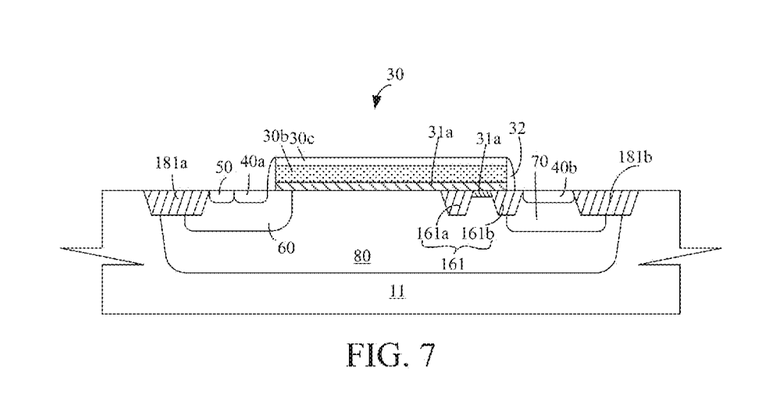
FIG. 7 schematically illustrates another HVMOS device with a thicker gate oxide layer.
Figure 8:
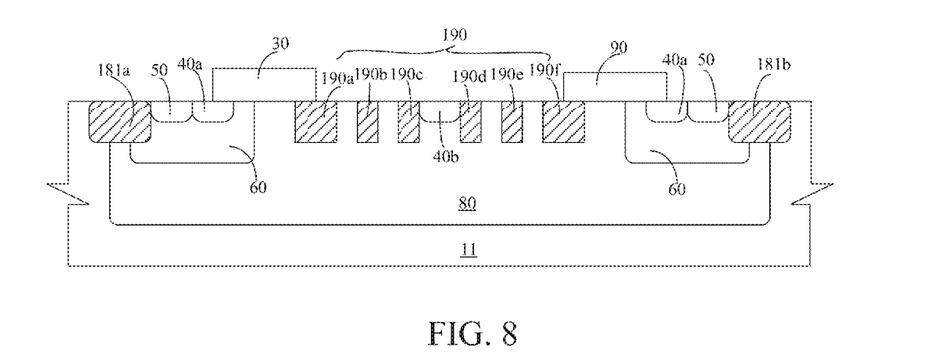
FIG. 8 schematically illustrates a HVMOS device with double gates according to an embodiment of the present invention.
Figure 9A:
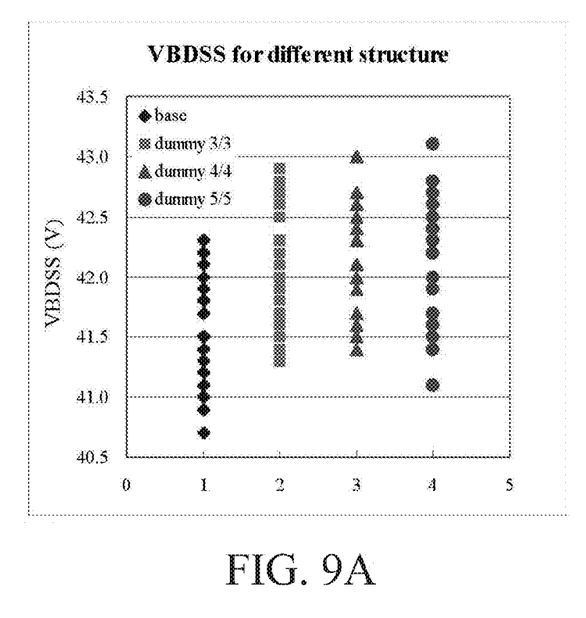
FIG. 9A schematically illustrates the relationship between the breakdown voltage and the number of segments of the first isolation structure.
Figure 9B:
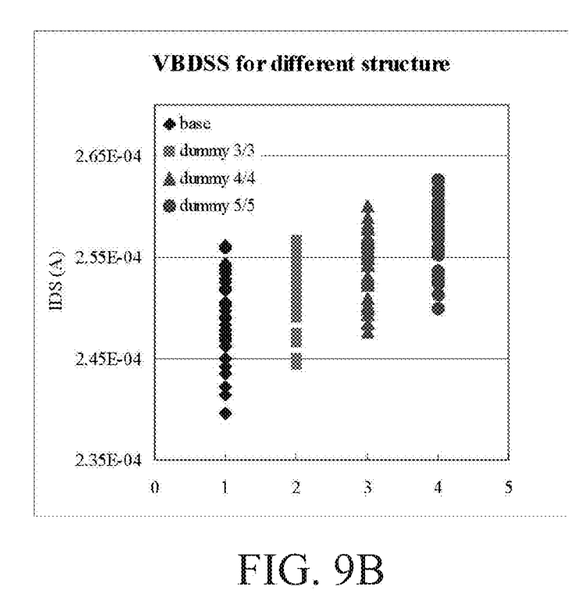
FIG. 9B schematically illustrates the relationship between the current and the number of segments of the first isolation structure.

FIGS. 1-6 schematically illustrate a partial process flow of a method for fabricating a high voltage metal oxide semiconductor (HVMOS) device according to an embodiment of the present invention. FIG. 7 schematically illustrates another HVMOS device with a thicker gate oxide layer. FIG. 8 schematically illustrates a HVMOS device with double gates. FIG. 9A schematically illustrates the relationship between the breakdown voltage and the number of segments of the first isolation structure. FIG. 9B schematically illustrates the relationship between the current and the number of segments of the first isolation structure.

Figure 1:
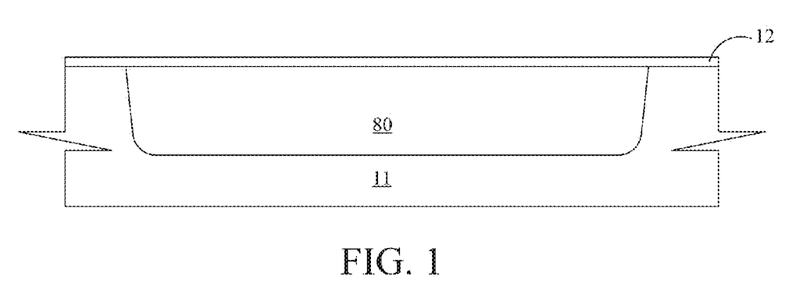
FIG. 1 schematically illustrates a step of forming an oxide layer over a substrate according to an embodiment of the present invention.
Figure 2:
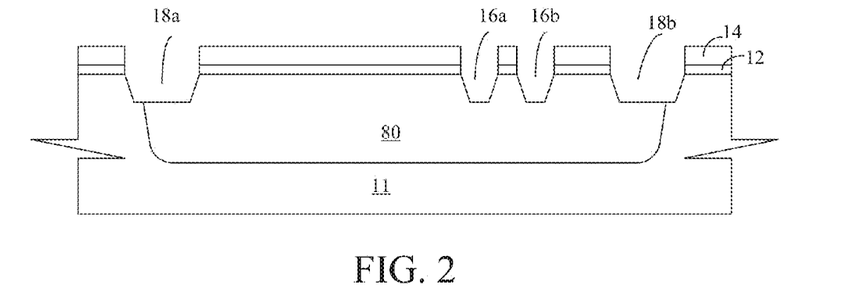
FIG. 2 schematically illustrates a step of forming plural trenches in the substrate according to an embodiment of the present invention.

Firstly, as shown in FIG. 1, a substrate 11 is provided. The substrate 11 is a first conductivity type substrate such as a p-type substrate. Then, an oxide layer 12 is successively formed over the substrate 11. In this embodiment, the oxide layer 12 is made of silicon dioxide ($SiO_2$). Then, a photolithography process is performed to form an N-well region 80 in the substrate 11. Then, refer to FIG. 2, a nitride layer 14 is formed on the oxide layer 12, and a photolithography and etching step is performed to pattern a photoresist layer (not shown) on the nitride layer 14 and then partially remove the nitride layer 14, the oxide layer 12 and the substrate 11. As a result, plural first trenches 16a and 16b and plural second trenches 18a and 18b are defined in the substrate 11. As shown in FIG. 2, the second trenches 18a and 18b are arranged at bilateral edges of the first trenches 16a and 16b. In this embodiment, the depth of first trench 16a and 16b is different between that of the second trench 18a and 18b due to the different lateral size. In FIG. 2, the size or depth of the trench is schematic only and does not represent the actual size or depth.

Figure 3:
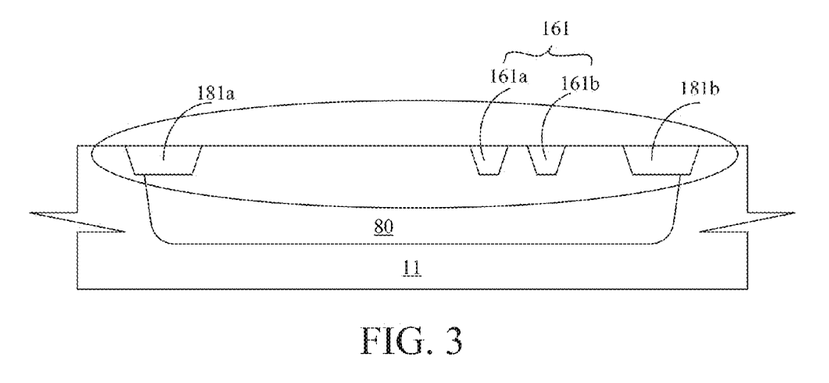
FIG. 3 schematically illustrates a step of filling a dielectric material into the trenches to form plural first isolation structures and a multi-segment first isolation structure according to an embodiment of the present invention.

Then, a dielectric material is filled into the plural first trenches 16a and 16b and the plural second trenches 18a and 18b and is covered the surface of the nitride layer 14. A flattening process using the nitride layer 14 as a stop layer is performed to remove excess dielectric material. Then, the nitride layer 14 and the oxide layer 12 are partially removed to form a first isolation structure 161 and plural second isolation structures 181a, 181b are formed in the substrate 11. As shown in FIG. 3, in this embodiment, the first isolation structure 161 comprises a first segment 161a and a second segment 161b. In this embodiment, the first isolation structure 161 and the second isolation structures 181a, 181b are shallow trench isolation (STI) structures. It is noted that the first isolation structure 161 and the second isolation structures 181a, 181b are formed prior to the formation of the N-well region 80 in alternative embodiment.

Figure 4A:
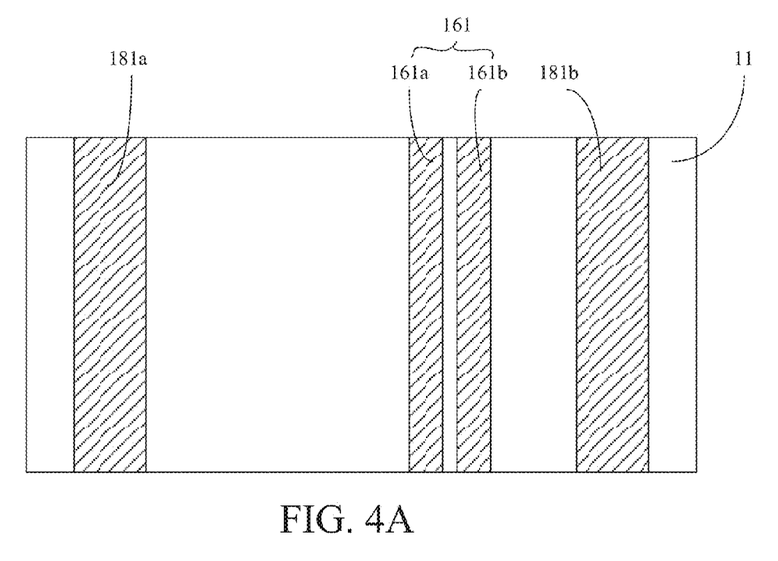
FIGS. 4A-4D schematically illustrate some exemplary arrangements of the multi-segment first isolation structure of a HVMOS device according to an embodiment of the present invention.
Figure 4B:
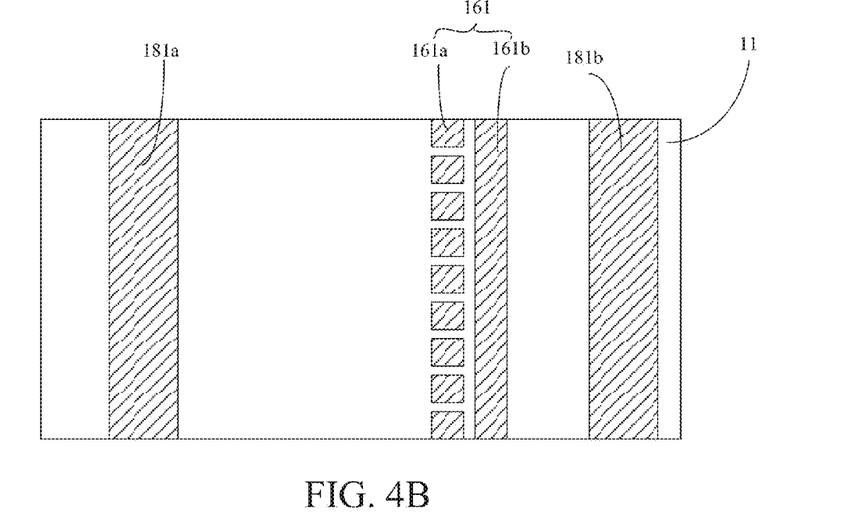
Figure 4C:
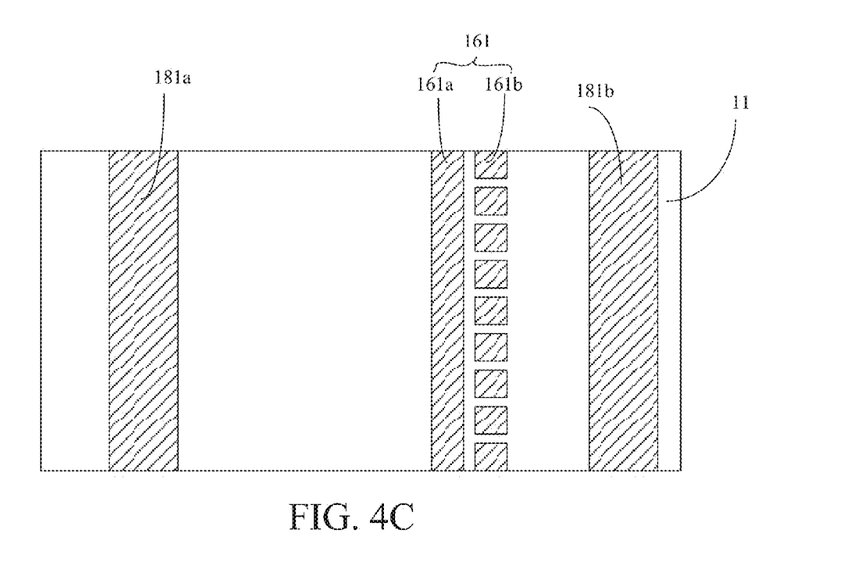
Figure 4D:
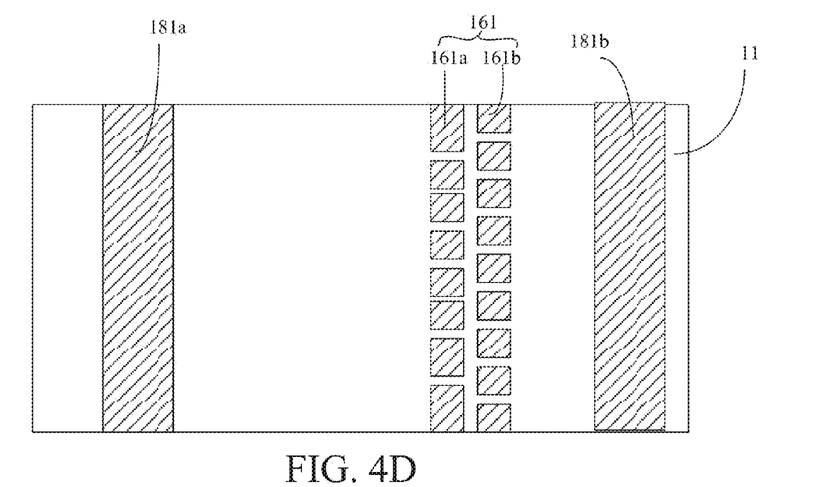

It is noted that the aspect ratio of each segment of the first isolation structure 161 is greater than the aspect ratio of the second isolation structure 181a or 181b. The aspect ratios of the segments 161a and 161b of the first isolation structure 161 may be identical or different. The first isolation structure 161 is a multi-segment isolation structure comprising plural segments. For clarification, only two segments are shown in this embodiment. As shown in FIGS. 4A-4D, the first segment 161a and the second segment 161b may be arranged in the substrate 11 in diverse forms. As shown in FIG. 4A, the segments of the first isolation structure are continuous segments. As shown in FIGS. 4B and 4C, the continuous segments and the discontinuous segments are alternately arranged in the substrates 11 and electrically disconnected from each other. As shown in FIG. 4D, each of the plural segments is a discontinuous segment with plural sub-segments, and the sub-segments of every two adjacent discontinuous segments are arranged in the substrates 11 in a staggered form and electrically disconnected from each other. Since the continuous segments and the discontinuous segments of the first isolation structure are arranged in an alternate or staggered form, if the breakdown voltage is increased, the plural segments may increase the conduction path of the current and block the current from directly entering the drift region from the body region. In this situation, the on-state resistance is reduced.

Figure 5:
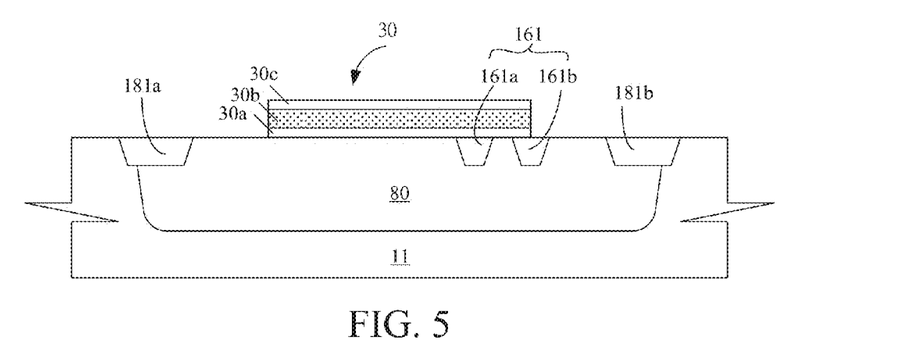
FIG. 5 schematically illustrates a step of forming a gate structure on the substrate and forming a source region and a drain region in the substrate according to an embodiment of the present invention.

Then, as shown in FIG. 5, a gate structure 30 is formed on the substrate 11 by a semiconductor fabricating process. The process of forming the gate structure 30 will be illustrated as follows. Firstly, a gate oxide layer 30a is formed on the substrate 11, and the first isolation structures 161 and the second isolation structures 181a, 181b are covered by the gate oxide layer 30a. Then, a polysilicon layer 30b is formed on the gate oxide layer 30a. The gate oxide layer 30a is made of silicon dioxide. Then, a second photolithography and etching step is performed to pattern a photoresist layer (not shown) on the polysilicon layer 30b and then partially and successively remove the polysilicon layer 30b and the gate oxide layer 30a. As a result, a gate structure 30 is formed on the substrate 11. The gate structure 30 is partially overlapped with the first isolation structure 161 in the substrate 11.

Please refer to FIG. 5 again. By using the gate structure 30 as a mask, the substrate 11 is doped with a second conductivity type dopant. As a result, a source region 40a and a drain region 40b with a second conductivity type are formed in the substrate 11. Then, an oxide layer such as a silicon dioxide layer (not shown) or a nitride layer (not shown) such as a silicon nitride layer is deposited on the gate structure 30 and the surface of the substrate 11. By etching a part of the oxide layer, a spacer 32 is formed on a sidewall of the gate structure 30 (see FIG. 6).

Figure 6:
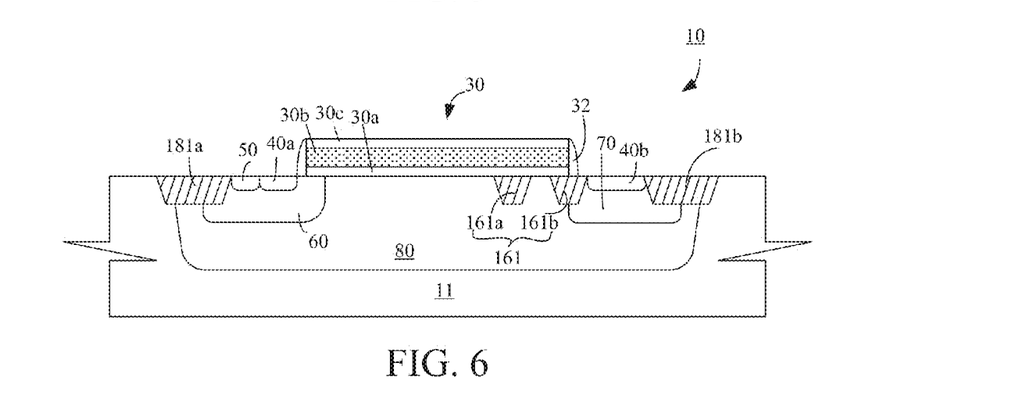
FIG. 6 schematically illustrates a step of forming a first body region and a drift region by ion-implanting processes to produce a HVMOS device according to an embodiment of the present invention.

Please refer to FIG. 6. By using the gate structure 30 and the spacer 32 as a mask, an ion-implanting process is performed to dope the substrate 11 with a first conductive type dopant at the area between the source region 40a and the second isolation structure 181a. As a consequence, a first body region 50 is formed. Then, by using the gate structure 30 and the spacer 32 as a mask, another ion-implanting process is performed to dope the substrate 11 with a second conductive type dopant. As a result, a second body region 60 and a drift region 70 with higher concentration of dopant are formed in the substrate 11. The second body region 60 and the drift region 70 have the same conductivity type as the source region 40a and the drain region 40b; but the dopant concentrations of the second body region 60 and the drift region 70 are higher than those of the source region 40a and the drain region 40b. The second body region 60 is arranged under the first body region 50 and the source region 40a and partially surrounds the second isolation structure 181a. The drift region 70 is arranged under the drain region 40b and partially surrounds the second segment 161b of the first isolation structure 161 and the second isolation structure 181b.

Please refer to FIG. 6 again. Then, a further ion-implanting process is performed to dope the substrate 11 with a second conductive type dopant at a deeper area of the substrate 11. As a consequence, a well region 80 is formed in the substrate 11. The well region 80 partially surrounds the first isolation structure 161 and the second isolation structures 181a, 181b, and encloses the second body region 60 and the drift region 70. Meanwhile, a high voltage metal oxide semiconductor (HVMOS) device 10 is produced. Then, a silicide layer 30c is formed on the polysilicon layer 30b in the gate structure 30, the formation steps comprising: the metal layer (not shown) is deposited on the surface of the polysilicon layer 30b and an exposed surface of the substrate 11 above the source/drain region 40a, 40b; an annealing process is performed to react the metal layer with the surface of the polysilicon layer 30b in the gate structure 30 and react with the exposed surface of the source/drain region 40a, 40b to form a silicide; an unreacted metal layer is removed; and finally, another annealing process is performed to change the silicide phase into the silicide phase with lower resistance. Herein, the silicide layer 30 is made of tungsten silicide ($WSi_x$), cobalt silicide, nickel silicide, or titanium silicide.

In the above embodiment, in order to form a thicker gate oxide layer in the LDMOS device region on the substrate 11, an extra process may be provided during the LDMOS process. However, in another embodiment, the HVMOS device (not shown) may include a LDMOS device and a fully depleted metal oxide semiconductor (FDMOS) device (not shown) on the substrate 11. Thus, the substrate 11 can separate into two regions (now shown), one region is for forming LDMOS device, and another region is for forming FDMOS device. When a higher operating voltage is applied to the gate (now shown) and drain region (not shown) in the FDMOS device, the gate oxide layer (not shown) needs a thicker thickness to sustain the higher operating voltage. Thus, in order to form a thicker gate oxide layer to sustain the higher operating voltage in the LDMOS device region, the gate oxide layer in the LDMOS region and the gate oxide layer in the FDMOS region can be produced by FDMOS process at the same time. Thus, the thicker gate oxide layer 31a can be obtained and the thickness is thicker than the gate oxide layer 30a as shown in FIG. 7. Therefore, a thicker gate oxide layer 31a in the LDMOS region on the substrate 11 can also improve the source-drain on-state resistance (Rdson). Under this circumstance, a gate oxide layer 31a is formed on the substrate 11 and in the area between the first segment 161a and the second segment 161b of the first isolation structure 16.

By the above fabricating method, the HVMOS device as shown in FIG. 6 or FIG. 7 is produced. The multi-segment arrangement of the first isolation structure 161 may interfere with the electric field to get higher breakdown voltage. Moreover, since the length of the length of the multi-segment isolation structure is shorter, the source-drain on-state resistance will be reduced. An example of the HVMOS device 10 is a lateral diffusion metal oxide semiconductor (LDMOS) device.

It is noted that numerous modifications and alterations may be made while retaining the teachings of the invention. In the high voltage metal oxide semiconductor (HVMOS) device of FIG. 8, two gates 30 and 90 are formed on the substrate 11. In this HVMOS device, the active region is arranged between the drain region 40b and the channel. In addition, plural segments 190a-190f of the multi-segment first isolation structure 190 are arranged between the second body region 60 and the drift region 70. In such way, the HVMOS device can withstand a high breakdown voltage and operate at a low source-drain on-state resistance (Rdson). The fabricating method and the functions of associated components are similar to those of the above embodiment, and are not redundantly described herein.

In the above embodiment, the present invention is illustrated by referring to a first isolation structure with two segments. Nevertheless, the second isolation structure may be divided into three segments, four segments or more than four segments. The relationship between the breakdown voltage and the number of segments of the second isolation structure will be illustrated with reference to FIG. 9A. In a case of the diamond symbol illustrates that a first isolation structure with a single segment is arranged between the second body region 60 and the drift region 70, the breakdown voltage is lower than 42.5 volts. In a case of the rectangular symbol illustrates that a first isolation structure with three segments is arranged between the second body region 60 and the drift region 70, the breakdown voltage is increased by 0.5 volts in comparison with the first isolation structure with a single segment, but the breakdown voltage is increased to nearly 43 volts. Whereas, in a case of the triangle symbol illustrates that a first isolation structure with four segments is arranged between the second body region 60 and the drift region 70, the breakdown voltage is increased to be about 43 volts. Whereas, in a case of circular symbol illustrates that a first isolation structure with five segments is arranged between the second body region 60 and the drift region 70, the breakdown voltage is increased to be greater than 43 volts.

Obviously, as the first isolation structure arranged between the second body region 60 and the drift region 70 is divided into more segments, the breakdown voltage is higher. In this situation, the HVMOS device can withstand high breakdown voltage and thus applied to high-voltage electronic products.

Hereinafter, the relationship between the current and the number of segments of the first isolation structure will be illustrated with reference to FIG. 9B. In a case diamond symbol illustrates that a first isolation structure with a single segment is arranged between the second body region 60 and the drift region 70, the current is about $2.55 \times 10^{-4}$ ampere (A). In a case the rectangular symbol illustrates that a first isolation structure with three segments is arranged between the second body region 60 and the drift region 70, the current is higher than $2.55 \times 10^{-4}$ ampere (A). Whereas, in a case triangle symbol illustrates that a first isolation structure with four segments is arranged between the second body region 60 and the drift region 70, the current is about $2.6 \times 10^{-4}$ ampere (A). Whereas, in a case of the circular symbol illustrates that a first isolation structure with five segments is arranged between the second body region 60 and the drift region 70, the current is about $2.63 \times 10^{-4}$ ampere (A).

From the above description, as the isolation structure arranged between the second body region 60 and the drift region 70 is divided into more segments, higher current is obtained. That is, the on-state resistance between the second body region 60 and the drift region 70 is lowered. By changing the first isolation structure between the second body region 60 and the drift region 70, the breakdown voltage is increased and the on-state resistance is reduced. In other words, the process of fabricating the HVMOS device is substantially unchanged as long as the pattern of the photoresist layer for producing the structure is varied according to the practical requirements.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A high voltage metal oxide semiconductor device, comprising:
    a substrate;
    a multi-segment first isolation structure formed in the substrate, and comprising plural segments;
    a source region and a drain region respectively arranged at bilateral sides of the multi-segment first isolation structure;
    a gate structure disposed over at least a portion of the multi-segment first isolation structure;
    a second body region, arranged under the gate structure and surrounding the source region, wherein the second body region has a conductivity type identical to that of the source region and the drain region;
    a drift region partially arranged under the multi segment first isolation structure and surrounding the drain region; and
    wherein the multi-segment first isolation structure comprises plural discontinuous segments, wherein each of the discontinuous segments comprises plural sub-segments and the plural sub-segments of every two adjacent discontinuous segments are arranged in the substrate in a staggered form.

2. The high voltage metal oxide semiconductor device according to claim 1, further comprising plural second isolation structures, which are formed in the substrate, and the drain region is arranged between the multi-segment first isolation structure and one of the plural second isolation structures.

3. The high voltage metal oxide semiconductor device according to claim 2, wherein the multi-segment first isolation structure and the plural second isolation structure are shallow trench isolation (STI) structures.

4. The high voltage metal oxide semiconductor device according to claim 2, wherein the aspect ratio of each segment of the multi-segment first isolation structure is greater than the aspect ratio of each of the second isolation structures.

5. The high voltage metal oxide semiconductor device according to claim 2, further comprising a first body region, which is arranged between the source region and one of the plural second isolation structures.

6. The high voltage metal oxide semiconductor device according to claim 2, further comprising a well region, which is formed in the substrate and partially surrounds the multi-segment first isolation structure and the second isolation structures.

7. The high voltage metal oxide semiconductor device according to claim 2, wherein the aspect ratios of the plural segments of the multi-segment first isolation structure are identical.

8. The high voltage metal oxide semiconductor device according to claim 1, wherein the multi-segment first isolation structure comprises at least one continuous segment and at least one discontinuous segment, which are alternately arranged in the substrate.

9. The high voltage metal oxide semiconductor device according to claim 1, further comprising a gate oxide layer between two segments of the multi-segment first isolation structure.

10. The high voltage metal oxide semiconductor device according to claim 1, further comprising a spacer, which is formed on a sidewall of the gate structure.

11. A semiconductor device, comprising:
a substrate;
a gate structure formed on the substrate;
a source region and a drain region formed in the substrate;
a body region, arranged under the gate structure and surrounding the source region, wherein the body region has a conductivity type identical to that of the source region and the drain region;
a drift region partially arranged under the multi segment first isolation structure and surrounding the drain region;
a multi-segment first isolation structure formed under a the gate structure, and comprising plural segments, wherein the multi-segment first isolation structure is partially overlapped with the gate structure and discontinuously arranged in a path directly from the source region to the drain region wherein each of the discontinuous segments comprises plural sub-segments and the plural sub-segments of every two adjacent discontinuous segments are arranged in the substrate in a staggered form; and
plural second isolation structures arranged at bilateral sides of the substrate.

12. The semiconductor device according to claim 11, wherein the multi-segment first isolation structure and the plural second isolation structure are shallow trench isolation (STI) structures.

13. The semiconductor device according to claim 11, wherein the aspect ratio of each segment of the multi-segment first isolation structure is greater than the aspect ratio of each of the second isolation structures.

14. The semiconductor device according to claim 11, wherein the aspect ratios of the plural segments of the first isolation structure are identical.

15. The semiconductor device according to claim 11, wherein the multi-segment first isolation structure comprises at least one continuous segment and at least one discontinuous segment, which are alternately arranged in the substrate.

16. The high voltage metal oxide semiconductor device according to claim 1, wherein the plural segments of the multi-segment first isolation structure are discontinuously arranged in a path directly from the source region to the drain region and disconnected each other.

* * * * *